United States Patent [19]

Allen

[11] 4,249,092

[45] Feb. 3, 1981

[54] CCD FREQUENCY DIVIDER CIRCUIT

[75] Inventor: Reginald A. Allen, Los Angeles, Calif.

[73] Assignee: TRW Inc., Redondo Beach, Calif.

[21] Appl. No.: 83,042

[22] Filed: Oct. 9, 1979

[51] Int. Cl.³ .................. G11C 19/28; H01L 29/78
[52] U.S. Cl. .................................. 307/221 D; 357/24
[58] Field of Search .................. 357/24; 307/221 D

[56] References Cited

U.S. PATENT DOCUMENTS

4,135,104  1/1979  Allen ........................... 307/221 D

Primary Examiner—Gene M. Munson
Attorney, Agent, or Firm—Andra M. Finkel; John J. Connors

[57] ABSTRACT

A charge coupled device (CCD) frequency divider circuit for dividing the frequency of an input signal comprises a CCD having main, drain, and feedback channels. Input signal charge is injected during each cycle of the input signal into a potential well under a storage electrode that retains a predetermined quantity of charge. Overflow from the storage electrode is detected by a sensing electrode that is normally maintained in a transfer state, causing the sensing electrode to switch to a barrier state. This allows the predetermined quantity of charge to advance to an output while the overflow is dumped out by the drain channel. However, when no overflow is present, the sensing electrode causes the input charge to be transferred into the feedback channel which circulates it to the storage electrode to combine with another input charge received by the storage electrode during a subsequent cycle of the input signal. The feedback channel includes delay electrodes which delay the charge in the feedback channel from combining with the input charge until a predetermined number of cycles of the input signal have passed. The frequency of the input signal is divided by an even number dependent upon the number of cycles by which the delay electrodes delay the charge in the feedback channel from combining with a new input charge to give a whole number of output cycles. Initialization of the circuit may also be accomplished by adding to or dumping the charge that is circulating in the feedback channel.

22 Claims, 6 Drawing Figures

CCD FREQUENCY DIVIDER CIRCUIT

BACKGROUND OF THE INVENTION

U.S. Pat. No. 4,135,104 discloses a CCD (charge coupled device) regenerator circuit that overcomes the problem of gradual dissipation of charge associated with digital CCDs while also providing elemental logic and arithmetic functions. A standardized quantity of charge is injected along with charge less than a predetermined quantity into a potential well under a storge electrode arranged to retain only a predetermined quantity of charge. Overflow from the storage electrode represents charge in excess of the predetermined quantity. It is detected by a master electrode that controls a slave electrode. The slave electrode forms a shunt path for the predetermined quantity of charge and is normally maintained in a transfer state. The slave electrode shifts to a barrier state when the excess charge is present however, permitting the predetermined quantity of charge to advance along another electrode path. Consequently, when a quantity of charge representing an assigned binary value is applied to the regenerator circuit, a predetermined quantity of charge representing the same binary value is transferred out, without inversion. In the absence of a charge at the binary input indicating the alternate binary value, the charge under the storage electrode is directed out the shunt path. By appropriate use of additional input transfer electrodes and output transfer electrodes the regenerator circuit serves as a basic unit which can provide fundamental logical and digital functions needed in digital systems.

THE INVENTION

I have modified the CCD regenerator circuit to divide the frequency of an input signal. I have achieved this by making the input channel and the complement output channel into one contiguous feedback channel.

The main feature of my invention is, when an input charge less than the predetermined quantity is applied to the input of the storage electrode during each cycle of the input signal, it is circulated in the feedback channel which is between the output and the input of the storage electrode. The charge in the feedback channel is combined with another input charge received by the storage electrode during a subsequent cycle of the input signal, so that the combined charge will be greater than or equal to the full charge packet. The feedback channel includes electrodes which delay the circulated charge in the feedback channel from combining with the input charge until a predetermined number of cycles of the input signal have passed. The frequency of the input signal will be divided by an even number n where the relationship between this number n and the delay of the circulated charge in the feedback channel is defined by the formula $$n = 2(\tau + 1)$$

where n is the number by which the frequency is divided, and $\tau$ is the number of cycles of the input signal by which the electrodes delay the charge in the feedback channel from combining with an input charge under the storage electrode, and the frequency of the input signal is such that when it is divided by n, it will result in a whole number of output cycles. Such a CCD circuit would be useful in multiplexers, filters, and synthesizers.

Useful, but optional elements, are additional electrodes and a source or sink diode coupled to the feedback channel. These additional elements cause the frequency divider circuit to become initialized such that upon start-up of the circuit, the storage electrode will either be void of charge or have a predetermined quantity of charge stored therein. This initialization enables the frequency divider circuit to have a predetermined output, that is, a binary "1" or "0."

The circuit of my invention includes, in addition to the feedback channel, main and drain channels. The main channel receives the input signal as a quantity of charge and includes the storage electrode which is capable of containing a predetermined quantity of charge and of transferring the charge therethrough. The main channel further includes an output means transfer electrode and output electrode coupled to the storage electrode for providing an output signal representative of a binary "1" when the predetermined quantity of charge is received from the storage electrode. The drain channel is coupled to the storage electrode and removes charge in excess of the predetermined quantity from the storage electrode. The feedback channel circulates charge from the transfer electrode when the charge therein is less than the predetermined quantity.

The circuit stores the input charge packet and the feedback change packet in a potential well under the storage electrode. Any charge in excess of the fixed quantity is directed into the drain channel. The drain channel includes a barrier electrode serially coupled to a master electrode and a sink diode. The feedback channel includes a plurality of feedback electrodes normally including one or more delay electrodes. A slave electrode is coupled between the feedback channel and the output transfer electrode. The slave electrode is also connected to the master electrode such that when charge in excess of the predetermined quantity biases the master electrode, the slave electrode becomes a barrier, preventing charge from flowing from the output electrode into the feedback channel.

The predetermined quantity of charge under the storage electrode is transferred to the output electrode while the slave electrode is a barrier. At the same time, the excess charge in the device is drained from the drain channel. When charge less than the predetermined quantity is present under the storage electrode, the slave electrode is at a transfer level, and the charge under storage electrode will circulate through the transfer electrode and the slave electrode to the feedback channel where it combines with a new input charge in the potential well under storage electrode until the slave electrode becomes a barrier, preventing charge from flowing from the output electrode into the feedback channel.

The predetermined quantity of charge under the storage electrode is transferred to the output electrode while the slave electrode is a barrier. At the same time, the excess charge in the device is drained from the drain channel. When charge less than the predetermined quantity is present under the storage electrode, the slave electrode is at a transfer level, and the charge under storage electrode will circulate through the output electrode and the slave electrode to the feedback channel until it combines with a new input charge in the potential well under the storage electrode. At this time, there will be no charge at the output. By preselecting the number of delay electrodes in the feedback channel, the circulated charge will not reach the potential well under the storage electrode for a number of clock cycles equivalent to the number of delay electrodes. Because there will not be enough input charge in the potential well to constitute the predetermined quantity until it is combined with the circulated charge, the frequency of the input charge will be divided by the number of clock cycles necessary for the predetermined quantity of charge to be stored in the potential well under the storage electrode.

Further in accordance with the invention, my circuit includes a diode for generating an input charge and first and second input electrodes which are serially coupled between the diode and the storage electrode. The input electrodes are biased such that, when charge is injected therein, an amount of charge less than the predetermined quantity will be clocked into the storage electrode.

In order to initialize the circuit such that charge representative of a binary "1" is supplied by the device as the first output signal, a second input may be coupled to the feedback channel such that excess charge will be provided through the feedback channel into the potential well under the storage electrode. Conversely, if a binary "0" is supplied by the device initially, a second sink diode is coupled to the feedback means to drain any excess charge that might be circulating therein, so that no excess charge will be provided into the potential well under the storage electrode.

BRIEF DESCRIPTION OF THE DRAWINGS

The invention will become apparent in light of the following detailed description taken in conjunction with the accompanying drawings, in which like reference numerals refer to like parts, and wherein.

DETAILED DESCRIPTION OF THE PREFERRED EMBODIMENT

Figure 1:
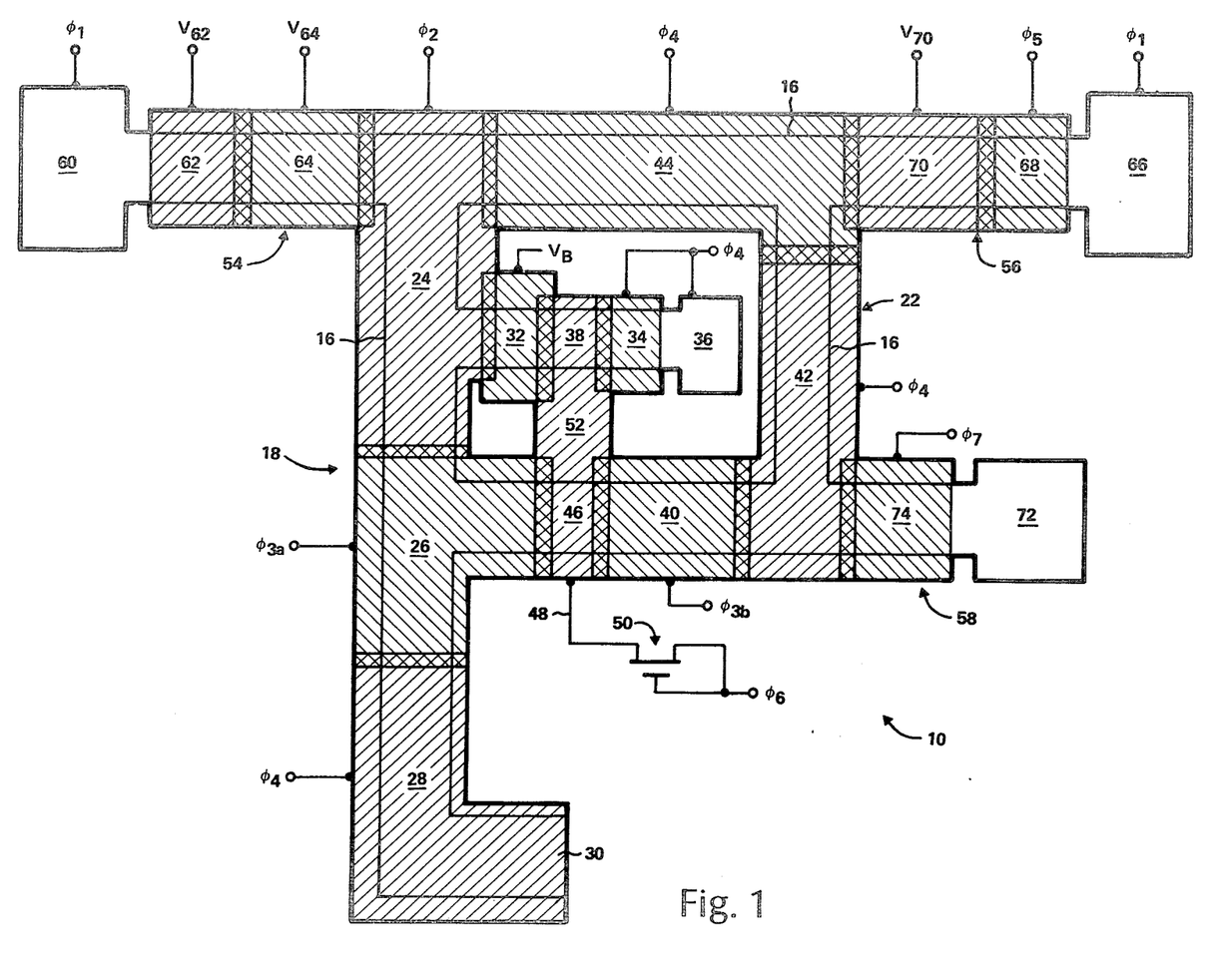
FIG. 1 is a schematic diagram of the frequency divider circuit of my invention.

FIG. 1 illustrates the best mode of my frequency divider circuit 10. In accordance with known techniques, the frequency divider circuit 10 is formed in a semi-conductor substrate having a thin layer of oxide deposited over its top surface. Buried in and distributed throughout the oxide layer are several electrodes which respond to selected variable voltage levels to create potential wells for the transferring and storing of charge. Potential wells, which are created by the application of clocking signals to the electrodes, are areas in the substrate in which charge can flow into and out of.

The sizes of the potential wells are dependent upon the geometric areas of the electrodes, and the magnitude of the applied clocking signals. The electrodes are coupled together by well-known techniques to define in the substrate an input channel 54, a main channel 18, a feedback channel 22, and a pair of initialization channels 56 and 58, and a drain channel 20.

The input channel 54 receives charge representative of the signal being divided and provides this charge to the main channel 18 and includes a source diode 60 serially coupled to input electrodes 62 and 64.

The main channel 18 includes a storage electrode 24 coupled to the output means comprising an output electrode 26 which is serially coupled to an output electrode 28, which includes the circuit output 30. The storage electrode 24 has an input which receives the input charge from the input channel 54. The potential well under electrode 24 is capable of containing a predetermined quantity of charge and of transferring that charge therethrough in response to a clocking signal $\phi_2$. The transfer electrode 26, in response to another clocking signal $\phi_{3a}$, provides an output signal to output electrode 28 when the predetermined quantity of charge is received from the storage electrode 24.

The drain channel 20 serves to drain charge in excess of the predetermined quantity from the storage electrode 24. It includes a barrier electrode 32 coupled to a sink diode 36. A master electrode 38 is coupled between the barrier electrode 32 and the drain electrode 34, and, as will be discussed below in detail, this master electrode is one component of a sensing electrode 52.

The feedback channel 22 circulates charge from the output electrode 26 back to the storage electrode 24. It is coupled between the output electrode 26 and the storage electrode 24, and operates in response to a clocking signal $\phi_4$. The feedback channel 22 includes feedback electrodes 40 and 42, and the delay electrode 44. A slave electrode 46 is coupled between the feedback channel 22 and the output electrode 26. This slave electrode 46 is connected to the master electrode 38 to form the sensing electrode 52 and is also connected through a lead 48 to a field effect transistor 50 such that when the field effect transistor is activated, charge will be transferred therethrough. The sensing electrode senses when a deficient quantity of charge, that is charge less than the predetermined quantity, is received by output electrode 26 from the storage electrode 24. This deficient charge is then transferred through the slave electrode into the feedback channel where it is circulated into the storage electrode 24.

The initialization channel 56 serves to add excess charge to the circuit 10 upon startup such that a charge corresponding to a binary 1 will be initially read out at the output 30. It includes a source diode 66 coupled to the delay electrode 44 through a pair of electrodes 68 and 70. The other initialization channel 58 includes a sink diode 72 coupled to the electrode 42 through an electrode 74, and it serves to drain excess charge from the circuit 10 upon startup such that there will be a binary "0" signal initially at output 30.

Figure 2:
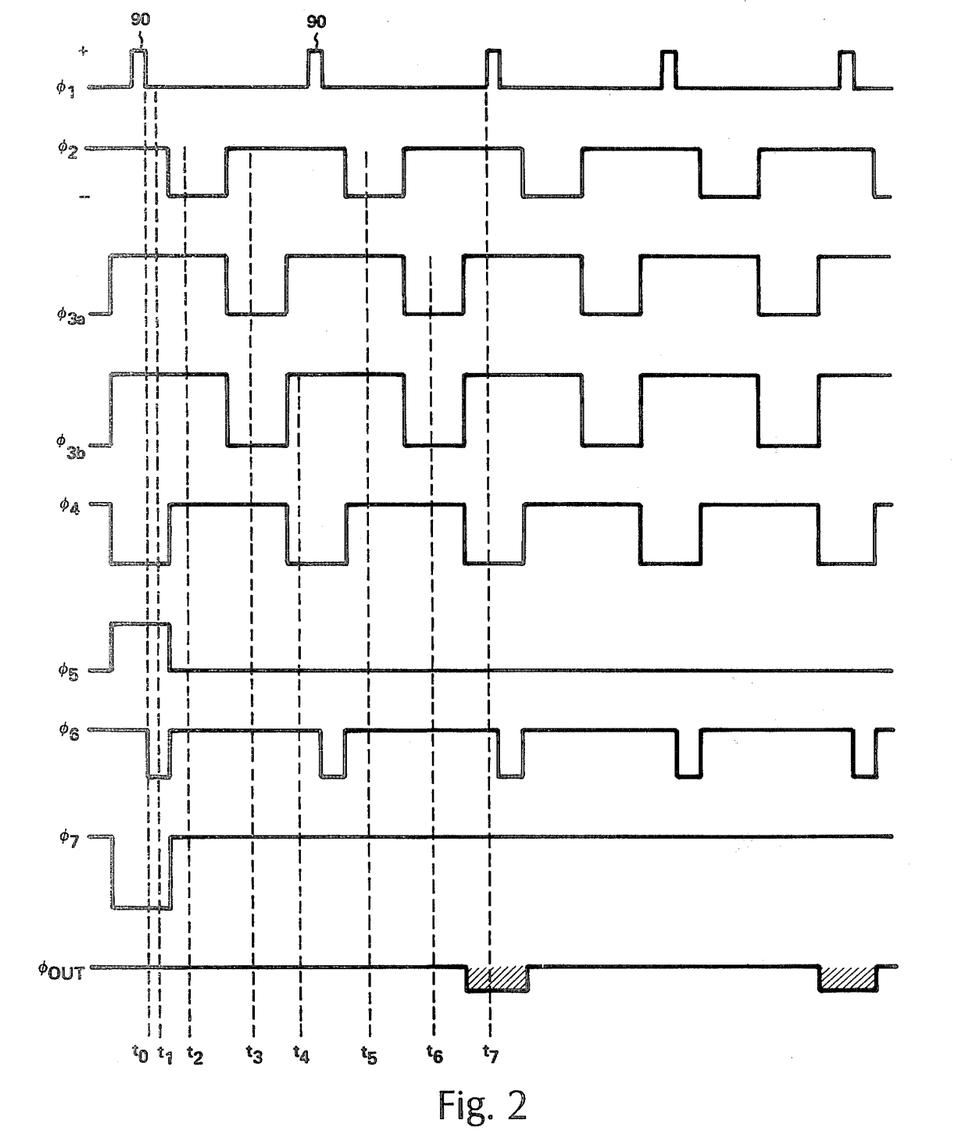
FIG. 2 is a timing diagram illustrating the operation of the frequency divider circuit of FIG. 1.

All the electrodes in FIG. 1 are responsive to clocking signals illustrated in FIG. 2. Clocking signals $\phi_1$ and $\phi_5$ are a succession of pulses that vary from zero to a positive voltage and provide the time-varying positive potential levels necessary to transfer charge in the source diodes 60 and 66 into storage electrode 24. Clocking signals $\phi_2$, $\phi_{3a}$, and $\phi_{3b}$, $\phi_4$ $\phi_6$, and $\phi_7$ are a succession of pulses varying from zero to a negative voltage level and provide the time varying negative potential levels necessary to transfer charge between adjacent electrodes of the circuit 10.

The input clocking signal $\phi_1$ is the input signal of a given frequency that is divided by circuit 10. It is a series of pulses 90, where the transition from the zero level to the positive level represented by the leading edge of each pulse 90 provides input charge to the source diode 60 and to the diode 66 causing the diodes to generate charge. The number of cycles over a given period of time corresponds to the input frequency of the input signal which is divided by the circuit 10. After each pulse 90, a frequency cycle is completed. The clocking signal $\phi_1$ has a frequency of two cycles per $t_7$. Each pair of cycles is referred to in terms of the times $t_0$-$t_7$ where the times $t_0$-$t_4$ occur within the first frequency cycle, and the times $t_5$-$t_7$ occur within the second frequency cycle.

Input clocking signal $\phi_1$ operates the source diodes 60 and 66 such that they are biased on when the pulse of the signal is positive. Clocking signal $\phi_2$ operates the storage electrode 24 when the pulses of signal $\phi_2$ are negative. When the pulses of clocking signals $\phi_{3a}$ and $\phi_{3b}$ are negative, they operate the transfer electrode 26 and the feedback electrode 40, respectively. Clocking signal $\phi_4$ operates the output electrode 28, feedback electrode 42, the delay electrode 44, the drain electrode 34, and the sink diode 36. Clocking signal $\phi_6$ operates the field effect transistor 50. Clocking signal $\phi_5$ operates the initialization electrode 68. Clocking signal $\phi_7$ operates the sink diode 72. An $\phi_{out}$ represents the output signal at the output 30.

Figure 3:
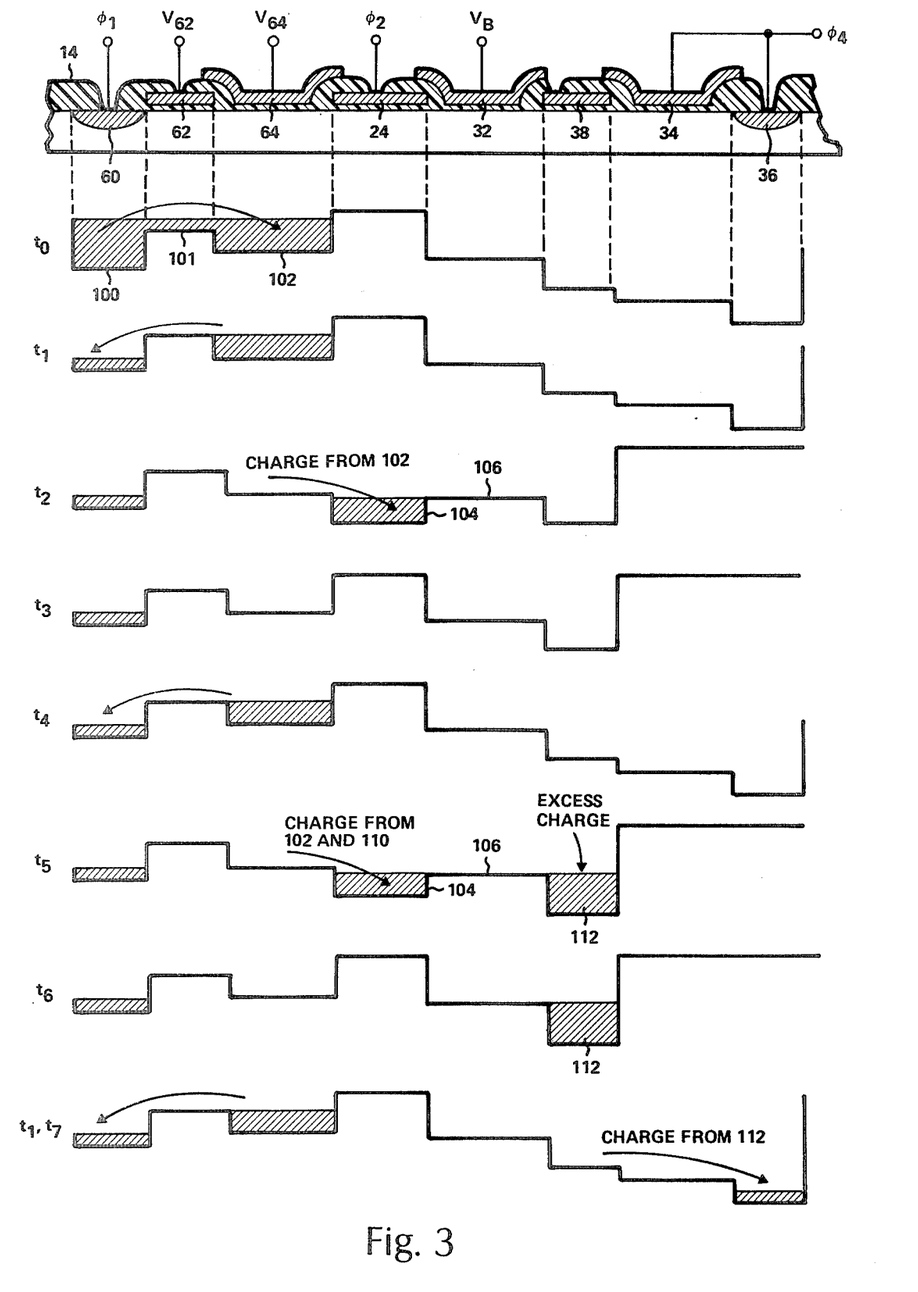
FIG. 3 is a schematic diagram illustrating the potential profiles associated with the main and the drain channels of the frequency divider circuit of FIG. 1 during successive time periods.
Figure 4:
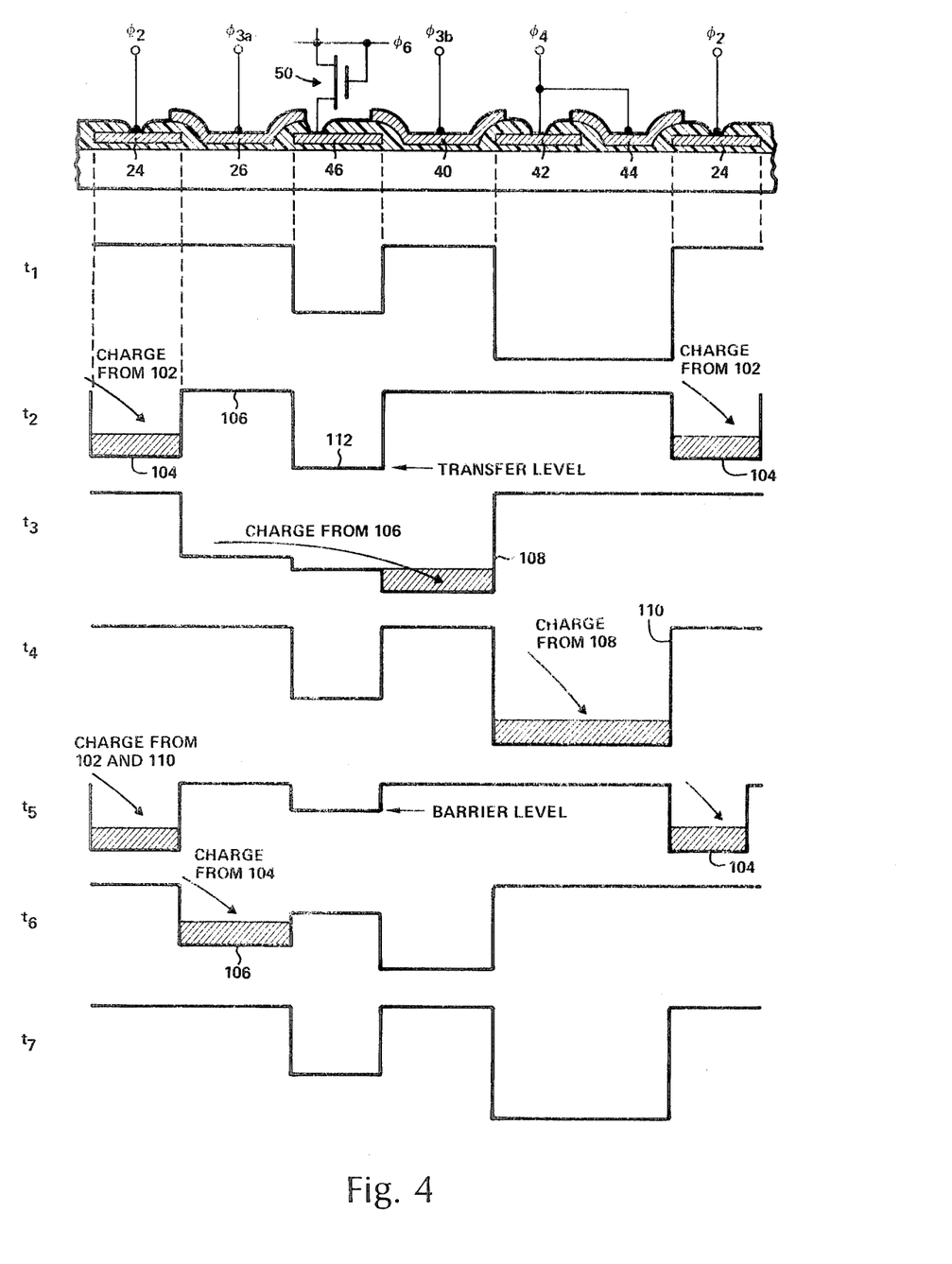
FIG. 4 is a schematic diagram illustrating the potential profiles of the feedback channel during successive time periods.

FIGS. 3 and 4 illustrate the distribution of the potential wells created in the substrate 12, beneath the electrodes of FIG. 1. Once the potential wells are created in the substrate 12, the circuit 10 can store charge. Stored charge will move only from a shallow potential well to a deeper one, determined by the signal applied to the electrode over the particular well under consideration. This is illustrated in FIGS. 3 and 4 by deeper wells being formed as the different clocking signals are applied to the various electrodes. To shift charge from one potential well to the adjacent well, a more negative clocking signal is applied to the next adjacent electrode to form a deeper potential well beneath the electrode receiving the charge. The process of transferring charge can then be repeated over and over again by applying the appropriate clocking signal to its respective electrode, then applying a second more negative clocking signal to an adjacent electrode.

As shown in FIGS. 1, 3, and 4, sequential formation of potential wells 100 through 116 at times $t_0$ through $t_7$ illustrate the flow of charge in circuit 10. During time $t_1$ the source diode 60 responds to the input clocking signal $\phi_1$ which applies charge to the input transfer electrodes 62 and 64. The voltages $V_{62}$ and $V_{64}$ that are respectively applied to the input transfer electrodes 62 and 64 are chosen such that when the diode 60 turns ON in response to the leading edge of the signal $\phi_1$ at the time $t_0$ the potential wells 100, 101, and 102, respectively under the source diode 60 and input transfer electrodes 62 and 64, will fill with charge, as indicated in FIG. 3. At the time $t_1$ when the clocking signal $\phi_1$ is turned off, the charge in the potential wells 101 and 102 spills back into the potential well 100 under source diode 60 such that a controlled amount of charge is left in the potential well 102.

The capacity of the potential well 102 is determined by an applied voltage $V_{64}$ and the geometric area of the electrode 64. This capacity is chosen such that at time $t_2$ when the charge in potential well 102 spills into the potential well 104 under the storage electrode 24, the potential well 104 will fill up until charge either reaches or is less than the height of a potential well 106 under the electrode 32. The height of potential well 106 is determined by the voltage $V_B$ applied to the barrier electrode 32. At the same time that the source diode 60 is ON during time $t_0$, the slave electrode 46 is preset to a transfer level by the transistor 50 as shown in FIG. 4 at the time $t_0$-$t_4$ This transfer level allows the charge in the potential well 104 to flow through potential well 106 under the electrode 26 to the deepest potential well 108 under the feedback electrode 40. This occurs at time $t_3$ when the charge in potential well 104 is less than the predetermined quantity and when the simultaneous clocking signals $\phi_{3a}$ and $\phi_{3b}$ are clocked ON.

When the charge in potential well 104 is greater than the predetermined quantity, so that there is excess charge in the potential well 112 under the master electrode, the excess charge will cause the master electrode to bias the slave electrode to become a barrier to the flow of charge such as during the time $t_5$ in FIG. 4.

During the time $t_5$ the new input charge from potential well 102 is combined with the charge from the potential well 110 in potential well 104. The charge in excess of the predetermined quantity in the potential well 104 flows over the barrier 106 into a potential well 112 under the master electrode 38 of the sensing electrode 52. This causes the slave electrode 46 of the sensing electrode 52 to operate as a barrier, hindering flow of charge into the feedback channel 22.

During time $t_6$ the charge in the potential well 104 is transferred into the potential well 106 under the electrode 26. However, because the charge under the master electrode 38 causes the slave electrode 46 to operate as a barrier, the charge will remain in potential well 106 rather than flowing into the potential well 108, as it did previously, during the time $t_4$.

During time $t_7$ the clocking signal $\phi_4$ causes the charge in the potential well 106 to drain out through the potential well 104 under electrode 24 to the output 30, where a binary "1" will be registered. At the same time, the excess charge in the potential well 112 under the master electrode 38 will drain out through the potential well under electrode 34 into the sink diode 36.

As can be seen by comparing the input and output waveforms $\phi_1$ and $\phi_{out}$ in FIG. 2, there is one output pulse for every two input pulses. Therefore, the circuit 10 serves as a divide-by-two circuit.

The first initialization channel, an optional feature, insures that a binary "1" is initially read out of the output 30. At start-up, the first initialization channel 56 adds charge to the feedback channel so that the first input charge will be combined with the initialization charge in the feedback channel to cause the predetermined quantity of charge to be present under the storage electrode. The diode 66 responds to the clocking signal $\phi_1$ to introduce the initialized charge through first initialization electrodes 68 and 70 into the feedback channel 22, at the same time that the source diode 60 introduces charge to the input transfer electrodes 62 and 64. Due to the additional input charge from the first initialization channel 56, charge will be added to the input charge from the input charge 54 to cause the potential well 104 under the storage electrode 24 to overflow. The excess charge will flow into the potential well 112 under the master electrode 38, causing the slave electrode 46 to act as a barrier. The predetermined quantity of charge representative of a binary "1" remaining in the potential well 104 will flow through the output transfer electrode 26 to the output 30. Conversely, in order that a binary "0" is initially provided to the output 30 by the frequency divider circuit 10, any charge that may be in the feedback channel 22 due to a prior utilization of the device will be drained out through the second initialization electrode 74 into a sink diode 72. This causes the slave electrode 46 to be preset to a transfer level so that, initially, all the charge introduced into the circuit 10 by the diode 60 is circulated in the feedback channel 22.

Alternate Embodiment

Figure 5:
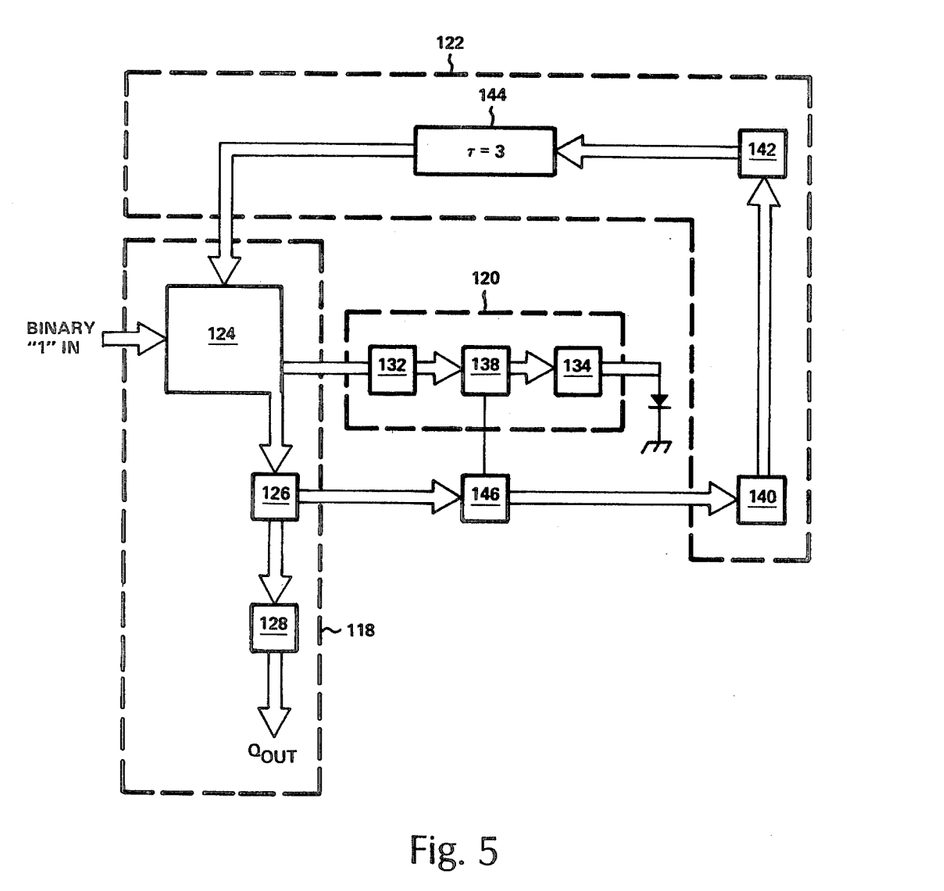
FIG. 5 is a block diagram of an alternative embodiment of the present invention in which the frequency divider circuit is configured as a divide-by-eight frequency divider circuit.

In some instances, it may be desirable to have the circuit 10 be capable of dividing the input frequency by other even numbers. FIG. 5 shows a circuit that is capable of dividing the input frequency by eight. The frequency divider circuit of FIG. 5, shown as a block diagram, comprises a main channel 118, a drain channel 120, and a feedback channel 122, similar to the main, drain, and feedback channels of FIG. 1. The main channel 118 is comprised of a storage electrode represented by block 124, a transfer electrode 126, and an output electrode 128. The drain channel 120 is comprised of a barrier electrode 132, a master electrode 138, and a drain electrode 134. The feedback channel 122 is coupled between a slave electrode 146 and the storage electrode 124. It is comprised of feedback electrodes 140 and 142 and multiple delay electrodes represented by block 144.

Figure 6:
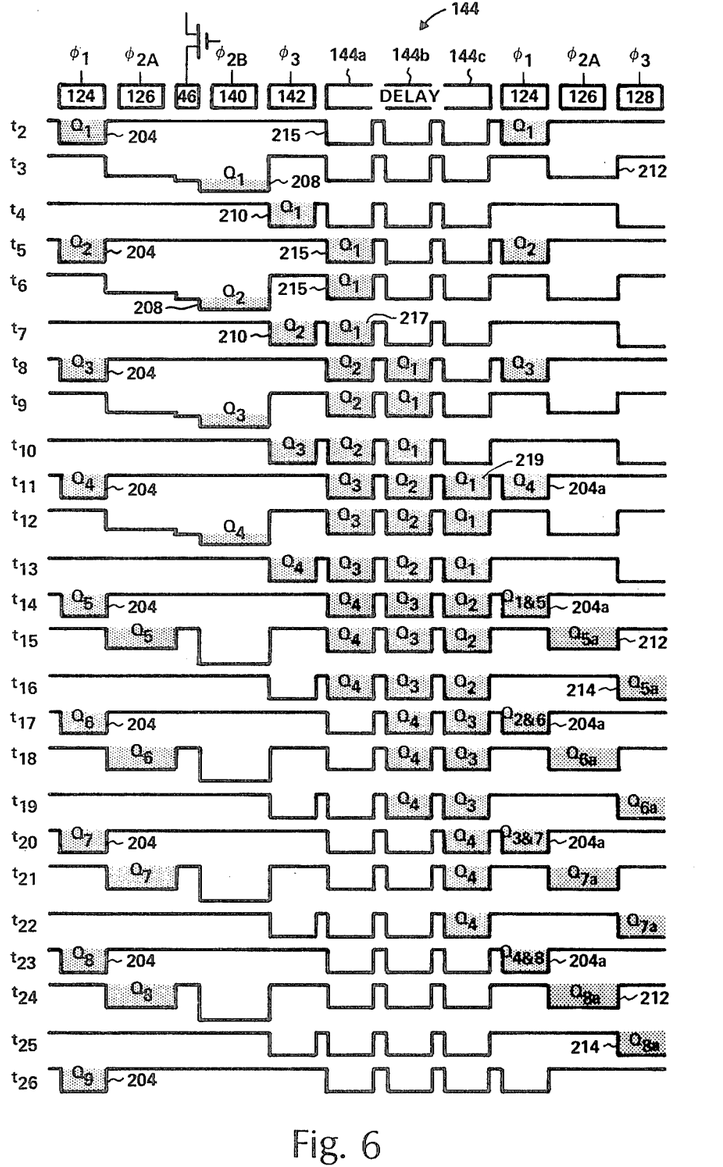
FIG. 6 is a schematic diagram which illustrates the potential profiles associated with the divide-by-eight frequency divider circuit of FIG. 5.

The delay circuit 144 may comprise a shift register or other appropriate delay means. The delay circuit 144 causes the charge in the feedback channel to be clocked through a series of electrodes similar to the delay electrode 44 in FIG. 1 before it is circulated into the storage electrode 124. This process causes several input charges to be clocked through the frequency divider circuit 120 before these charges are combined with the circulated charges in the feedback channel 122 to be equal to or exceed the predetermined quantity of storage electrode 124. The number of input charges that are clocked into the circuit 120 before the cycle repeats, as shown in FIG. 6, determines the frequency division. The mathematical formula describing this phenomenon is $n = 2(\tau + 1)$, where n is the frequency division (2, 4, 6, 8, ...) and $\tau$ is the delay in the number of input pulses. The frequency of the input signal, when divided by n will result in a whole number of output cycles. In this circuit, $\tau = 3$ such that the circuit divides the frequency by eight.

The electrodes of FIG. 5 are responsive to clocking signals shown in FIG. 2 to form potential wells in a substrate as shown in FIG. 6. In other, words, there would be a completed output cycle after every eight cycles of the input signal (assuming each input cycle comprises only one pulse). So, by way of illustration only, if the input signal was comprised of 32 cycles, there would be a completed output cycle after the eighth input cycle, after the sixteenth, after the twenty-fourth, and after the thirty-second.

As shown in FIG. 6, the sequential formation of potential wells 204 through 214 at times $t_2$ through times $t_{26}$ illustrate the flow of charge in circuit 100. The potential wells 204 and 204a represent the potential well under the storage electrode. Potential well 204a, however, represents the potential well after a frequency cycle. During the time $t_1$ a charge $Q_1$ is injected into the input transfer electrodes (not shown). At the time $t_2$ when the clocking signal $\phi_1$ is turned on, the charge $Q_1$ is transferred into the potential well 204 under the storage electrode 124. At the time $t_3$ when the clocking signals $\phi_{2A}$ and $\phi_{2B}$ are turned on, the charge $Q_1$ in the potential well 204 is transferred into the potential well 208 in the feedback channel 122, due to the fact that there is no excess charge in the circuit 120. At the time $t_4$, when the clocking signal $\phi_3$ is turned on, the charge $Q_1$ is clocked into the potential well 210 under electrode 142. During $\phi_1$ clocking signals, the charge $Q_1$ is transferred through an adjacent potential well of the delay circuit 144 as shown during the times $t_5$, $t_8$, and $t_{11}$. During time $t_5$, a new charge is transferred into the potential well 204, while the charge $Q_1$ from potential well 210 enters a potential well 215 under the first delay electrode 144a. During time $t_6$ while the charge $Q_2$ is transferred into the potential well 208, the charge $Q_1$ is delayed in the first potential well 215 of the delay circuit 144. During time $t_7$ the charge $Q_2$ is transferred into the potential well 210 while the charge $Q_1$ is still delayed in the potential well 215. At the time $t_8$ a new charge $Q_3$ is transferred into the potential well 204 while the charge $Q_2$ is transferred into the potential well 215 and the charge $Q_1$ is transferred into the potential well 217. At the time $t_9$ the charge $Q_3$ is clocked into potential well 208, and the charges $Q_2$ and $Q_1$ are delayed in their respective potential wells 215 and 217. At the time $t_{10}$ the charge $Q_3$ is transferred into the potential well 210, and the charges $Q_2$ and $Q_1$ are still delayed. At the time $t_{11}$ a new charge $Q_4$ is transferred into the potential well 204, and the charge $Q_3$ enters potential well 215 under the delay electrode 144a, while the charges $Q_2$ and $Q_1$ are transferred into potential wells 217 and 219 respectively. At the time $t_{12}$ the charge $Q_4$ is transferred into potential well 208, and the charges $Q_3$, $Q_2$, and $Q_1$ are delayed. At the time $t_{13}$ the charge $Q_4$ goes into the potential well 210 and the charges $Q_3$-$Q_1$ are still delayed. At the time $t_{14}$ a new charge $Q_5$ is transferred into the potential well 204, and the charges $Q_4$, $Q_3$, and $Q_2$ are transferred into the potential wells 215, 217, and 219, respectively, while the charge $Q_1$ is circulated back into potential well 204 and is combined with the charge $Q_5$ such that there is charge in excess of the predetermined quantity. During the time $t_{15}$ the excess charge is transferred into the potential well under the master electrode 138 (not shown) while the charge $Q_{5a}$ representative of the predetermined quantity is transferred into the potential well 212. The charges $Q_4$, $Q_3$, and $Q_2$ are still delayed. At the time $t_{16}$ the charge $Q_{5a}$ is clocked into the potential well 214 of the output electrode, while the charges $Q_4$, $Q_3$, and $Q_2$ are still delayed. At the time $t_{17}$ a charge $Q_6$ is clocked into the potential well 204, while no charge enters the potential well 215 under the delay electrode 144a, and the charges $Q_4$ and $Q_3$ are clocked into potential wells 217 and 219 respectively and the charge $Q_2$ and $Q_6$ are combined in the potential well under the storage electrode 124. After the excess charge has been drained off, at the time $t_{18}$ the charge $Q_{6a}$ is clocked into the potential well 212 and the charges $Q_4$ and $Q_3$ are still delayed. At the time $t_{19}$ while the charges $Q_4$ and $Q_3$ are still delayed, the charge $Q_{6a}$ is transferred into the potential well 214. At the time $t_{20}$ a new charge $Q_7$ is transferred into the potential well 204, and the charge $Q_4$ is transferred into the potential well 219, while the charge $Q_3$ is combined with the charge $Q_7$. At the time $t_{21}$ after the excess charge has flowed into the potential well under master electrode (not shown), the charge $Q_4$ is delayed, and the charge $Q_{7a}$ is transferred into the potential well 212. At the time $t_{22}$ while the charge $Q_4$ is still delayed, the charge $Q_{7a}$ is clocked into the potential well 214. During the time $t_{23}$ a new charge $Q_8$ is transferred into potential well 204 and is combined with charge $Q_4$ and during the times $t_{24}$ and $t_{25}$ the charge $Q_{8a}$ is clocked into the potential wells 212 and 214 respectively. At the time $t_{26}$ the cycle repeats itself when a new charge $Q_9$ is clocked into the potential well 204.

As can be seen, it takes eight input charges to complete the cycle. Therefore, the circuit in FIG. 5 is a divide-by-eight circuit.

From the above, it is apparent that by means of the present invention, there has been contributed to the art of charge coupled devices, frequency divider circuit that is capable of dividing an input frequency by an even number and that is capable of being initialized so as to control the initial phase of the output signals.

While the invention has been shown and described with reference to preferred embodiments thereof, it will be understood to those skilled in the art that suitable modifications may be made therein without departing from the scope and spirit of the invention.

I claim:

1. A circuit comprising:
   a semiconductor substrate storage means in said substrate having an input and being capable of containing a predetermined quantity of charge and of transferring charge therethrough;
   output means in said substrate coupled to said storage means for providing an output signal when said predetermined quantity is received therefrom and for transferring charge therethrough when the charge received is less than said predetermined quantity;
   drain means in said substrate for removing excess charge;
   charge sensing means having a master electrode and a slave electrode, said master electrode being responsive to charge in excess of said predetermined quantity at said storage means, and being operative to transfer said excess charge to said drain means;
   feedback means in said substrate coupled between said slave electrode and said input for circulating charge, said slave electrode transferring charge through said output means to said feedback means when no excess charge is being transferred through said master electrode, and serving as a barrier for charge at said output electrode means when excess charge is present at said master electrode,
   whereby when a quantity of charge less than said predetermined quantity is at said input, it is circulated through said output means, said slave electrode and said feedback means to said input, and when said quantity is combined at said input with additional charge such that said predetermined quantity is exceeded, the excess charge is removed through said master electrode said drain means, and said predetermined quantity is provided as an output signal from said output means.

2. The circuit of claim 1 further comprising a barrier electrode coupling said storage means to said master electrode, said barrier electrode inhibiting the transfer of a deficient amount of charge less than or equal to said predetermined quantity from said storage means to said master electrode during the time interval required for said diminished charge from said storage means to be transferred to said output means.

3. A circuit of claim 2 further comprising means for applying a voltage of such magnitude to said barrier electrode for inhibiting the transfer of a quantity of charge equal to or less than said predetermined quantity from said storage means to said master electrode, and further comprising means for applying a second voltage to said slave electrode such that charge is transferred therethrough.

4. A circuit of claim 1 further comprising means for periodically applying charge at a frequency to said input such that the circuit serves as a frequency divider.

5. A circuit of claim 4 wherein said applying means comprises:
   a diode responsive to an input signal representative of a fixed quantity of charge,
   a first input electrode coupled to said diode for receiving said fixed quantity therefrom,
   a second input electrode coupled between said first input electrode and said input for receiving a controlled amount of said fixed quantity and for transferring said amount therethrough to said input.

6. A circuit of claim 1 further comprising first initialization means coupled to said feedback means for providing charge to said input such that a first quantity of predetermined charge is initially provided as an output signal from said output means.

7. A circuit of claim 1 further comprising second initialization means coupled to said feedback means for selectively draining charge from said feedback means such that no charge will be initially provided as an output signal from said output means.

8. A circuit of claim 1 wherein said feedback means includes delay means for inhibiting the circulated charge supplied to said input a predetermined time interval.

9. A circuit comprising:
   a semiconductor substrate,
   a main channel in said substrate including a storage electrode having an input and being capable of containing a predetermined quantity of charge and of transferring charge therethrough and an output means coupled to said storage electrode for providing an output signal when said predetermined quantity is received therefrom and for transferring charge therethrough when the charge received is less than said predetermined quantity;
   drain means in said substrate for removing charge in excess of said predetermined quantity at said storage electrode;
   feedback means in said substrate interconnected with said main channel for circulating charge into said storage electrode when the charge received is less than said predetermined quantity;
   whereby when a quantity of charge less than said predetermined quantity is at said input, it is circulated in said feedback means, and when said quantity is combined at said input with additional charge such that said predetermined quantity is exceeded, the excess charge is removed through said drain means, and said predetermined quantity is provided as an output signal from said output means.

10. The circuit of claim 9 further comprising a master electrode coupled between said storage electrode and said drain means and connected to a slave electrode coupled between said output transfer electrode means and said feedback means, said master electrode being responsive to charge in excess of said predetermined quantity at said storage electrode and being operative to transfer said excess charge therethrugh, and said slave electrode serving to allow the transfer of charge through said output transfer electrode to said feedback means when no excess charge is being transferred through said master electrode, and serving as a barrier for charge at said output transfer electrode means when excess charge is present at said master electrode.

11. The circuit of claim 9 further comprising a barrier electrode, coupling said storage electrode to said master electrode, said barrier electrode having a barrier state for inhibiting the transfer of charge from said storage electrode to said master electrode during the time interval required for charge from said storage electrode to be transferred to said output means.

12. The circuit of claim 9 wherein said feedback channel means includes delay means for inhibiting the circulated charge supplied to said input a predetermined time interval.

13. The circuit of claim 12 further comprising means for periodically applying charge representative of an input signal having a frequency to said input such that the charge coupled device serves as a frequency divider, and said predetermined time interval is a predetermined number of cycles of the input signal.

14. The device of claim 9 further comprising first initialization means coupled to said feedback means for providing charge to said input such that a first quantity of predetermined charge is initially provided as an output signal from said output means.

15. The circuit of claim 9 further comprising second initialization means coupled to said feedback means for selectively draining charge from said feedback means such that no charge will be initially provided as an output signal from said output means.

16. The circuit of claim 9 further comprising a plurality of charge transfer electrodes extending over said main, drain, and feedback channel means so as to define, when energized, a plurality of charge storage sites in said substrate.

17. A charge coupled device frequency divider circuit, comprising:
a semiconductor substrate storage means in said substrate having an input and being capable of containing a predetermined quantity of charge and of transferring charge therethrough;
means for periodically applying charge at an input frequency to said input;
output means in said substrate coupled to said storage means for providing an output signal when said predetermined quantity is received therefrom and for transferring charge therethrough when the charge received is less than said predetermined quantity;
drain means in said substrate for removing excess charge;
charge sensing means having a master electrode and a slave electrode, said master electrode being responsive to charge in excess of said predetermined quantity at said storage electrode channel means and being operative to transfer said excess charge to said drain;
feedback means in said substrate coupled between said slave electrode and said input for circulating charge, said slave electrode serving to transfer charge through said output means to said feedback means if, and only if, no excess charge is being transferred through said master electrode, and serving as a barrier for charge at said output means if, and only if, excess charge is present at said master electrode,
whereby when a quantity of charge less than said predetermined quantity is at said input during any frequency cycle, it is circulated through said storage means, said output transfer electrode means, said slave electrode and said feedback means to said storage means, and no output signal is provided from said output means during said any frequency cycle, and when said quantity is combined at said input with additional charge during another frequency cycle such that said predetermined quantity is exceeded, the excess charge is removed through said master electrode, said drain channel means, and said predetermined quantity is provided as an output signal from said output means, during said other frequency cycle, such that said input frequency is divided.

18. A circuit which divides the frequency of an input signal to provide an output signal of one or more pulses, including
a semiconductor substrate storage means in said substrate having an input and output and adapted to store charge, said storage means upon containing a predetermined quantity of charge providing one pulse of the output signal,
means for providing to the storage means during each cycle of the input signal an input charge which is less than said predetermined quantity, and
feedback means in said substrate for circulating charge between the output and input of the storage means to combine the circulated charge with input charge received in the storage means during subsequent cycles of the input signal so that the combined charge equals or exceeds said predetermined quantity,
said feedback means including means for delaying for a predetermined number of cycles of the input signal the combination of circulated charge with the input charge received during subsequent cycles of the input signal so that the frequency of the output signal is divided.

19. The circuit of claim 18 including means for dividing the input frequency by an even number n where the relationship between said even number and said predetermined number of cycles of the input signal is defined by the formula $n = 2(\tau + 1)$ in which n is the number by which the frequency is divided, and $\tau$ is the number of cycles of the input signal by which the delay means delays the circulated charge from combining with the input charge, whereby the frequency of the input signal when divided by n will result in a whole number of output cycles.

20. A circuit for dividing the frequency of an input signal to provide an output signal of one or more pulses, including:
a semiconductor substrate means for repeatedly generating successive first, second, third, and fourth clocking signals,
means for providing an input charge in response to each first clocking signal,
storage means in said substrate having an input and output and adapted to store charge, said storage means receiving said input charge during each second clocking signal, and said storage means, upon containing a predetermined quantity of charge, providing one pulse of the output signal, and feedback means in said substrate for circulating charge between the output and input of the storage means in response to each fourth clocking signal to combine circulated charge with the input charge received in the storage means during a subsequent second clocking signal, so that the combined charge equals or exceeds said predetermined quantity, said feedback means including means for delaying predetermined number of cycles of the input signal the combination of circulated charge with the input charge received during subsequent cycles of the input signal, so that the frequency of the input signal is divided.

21. The circuit of claim 20 including means for dividing the input frequency by an even number n where the relationship between said even number and said predetermined number of cycles of the input signal is defined by the formula $$n = 2(\tau + 1)$$

in which n is the number by which the frequency is divided and $\tau$ is the number of cycles of the input signal by which the delay means delays the circulated charge from combining with the input charge.

22. A circuit for dividing a frequency of an input signal to provide an output signal of one or more pulses, comprising:

a semiconductor substrate a main channel in said substrate including a storage means having an input and adapted to store charge of a predetermined quantity and of transferring charge therethrough and an output means coupled to said storage means of providing an output signal when said predetermined quantity is received therefrom, and for transferring charge therethrough when the charge received is less than said predetermined quantity, means for providing to the main channel, during each cycle of the input signal, an input charge which is less than said predetermined quantity, and feedback means in said substrate interconnected with said main channel for circulating charge during subsequent cycles of the input signal when the charge received from the main channel is less than said predetermined quantity.

said feedback means including means for delaying the combination of circulated charge with the input charge received during a subsequent cycle of the input signal for a predetermined number of cycles of the input signal, so that the frequency of the output signal is divided by an even number n where the relationship between said even number and said predetermined number of cycles of the input signal is defined by the formula $$n = 2(\tau + 1)$$

in which n is the number by which the frequency is divided, and $\tau$ is the number of cycles of the input signal by which the delay means delays the circulated charge from combining with the input charge.

* * * * *

UNITED STATES PATENT AND TRADEMARK OFFICE
CERTIFICATE OF CORRECTION

PATENT NO. : 4,249,092

DATED : February 3, 1981

INVENTOR(S) : Reginald A. Allen

It is certified that error appears in the above-identified patent and that said Letters Patent is hereby corrected as shown below:

Column 1, line 12 "storge" should be deleted and --storage-- inserted therefor.

Column 6, line 67 "charge" (second instance) should be deleted and --channel-- substituted therefor.

Column 11, line 6 "therethrugh" should be deleted and --therethrough-- substituted therefor.

Signed and Sealed this

First Day of November 1983

[SEAL]

Attest:

GERALD J. MOSSINGHOFF

*Attesting Officer*   *Commissioner of Patents and Trademarks*